United States Patent
Lee et al.

(10) Patent No.: US 10,741,716 B2
(45) Date of Patent: Aug. 11, 2020

(54) WIRE PROCESSING APPARATUS AND METHOD FOR TABBING APPARATUS

(71) Applicant: ZEUS CO., LTD., Osan-si, Gyeonggi-do (KR)

(72) Inventors: Byeong Su Lee, Osan-si (KR); Young Ik Park, Osan-si (KR); Dong Jin Chung, Osan-si (KR); Shin Il Oh, Osan-si (KR)

(73) Assignee: ZEUS CO., LTD., Osan-si, Gyeonggi-Do (KR)

( * ) Notice: Subject to any disclaimer, the term of this patent is extended or adjusted under 35 U.S.C. 154(b) by 47 days.

(21) Appl. No.: 16/086,740

(22) PCT Filed: Feb. 21, 2017

(86) PCT No.: PCT/KR2017/001891
§ 371 (c)(1),
(2) Date: Feb. 4, 2019

(87) PCT Pub. No.: WO2017/164521
PCT Pub. Date: Sep. 28, 2017

(65) Prior Publication Data
US 2020/0013918 A1  Jan. 9, 2020

(30) Foreign Application Priority Data

Mar. 24, 2016  (KR) ........................ 10-2016-0035499

(51) Int. Cl.
*H01L 31/18* (2006.01)
*H01L 31/05* (2014.01)

(52) U.S. Cl.
CPC .............. *H01L 31/18* (2013.01); *H01L 31/05* (2013.01)

(58) Field of Classification Search
CPC ................................ H01L 31/18; H01L 31/05
(Continued)

(56) References Cited

U.S. PATENT DOCUMENTS 5,735,967 A   4/1998  Yakou et al.
9,450,137 B2  9/2016  Krause et al.
(Continued)

FOREIGN PATENT DOCUMENTS

CN  104160517   11/2014
JP   59-169028   11/1984
(Continued)

OTHER PUBLICATIONS

International Search Report for International Application No. PCT/KR2017/001891, dated Apr. 25, 2017.
(Continued)

*Primary Examiner* — Elias Ullah
(74) *Attorney, Agent, or Firm* — Kile Park Reed & Houtteman PLLC

(57) ABSTRACT

A wire processing apparatus for a tabbing apparatus is provided. The wire processing apparatus for a tabbing apparatus has: a wire supplying device cutting a wire to a predetermined length; a cell conveying device, on which the wire and a cell are placed, and which conveys the wire and the cell in a conveyance direction; and a wire transferring device receiving the wire from the wire supplying device and transferring the wire to the cell conveying device. The cell is placed on the wire in the state where the wire transferring device grips the wire placed on the cell conveying device.

19 Claims, 11 Drawing Sheets

(58) Field of Classification Search
USPC .......................................................... 438/98
See application file for complete search history.

(56) References Cited

U.S. PATENT DOCUMENTS

| | | |
|---|---|---|
| 9,673,349 B2 | 6/2017 | Kodama et al. |
| 2013/0277361 A1 | 10/2013 | Tan et al. |
| 2017/0229601 A1* | 8/2017 | Park ........................ H01L 31/05 |

FOREIGN PATENT DOCUMENTS

| | | |
|---|---|---|
| JP | 9-25059 | 1/1997 |
| JP | 10-279179 | 10/1998 |
| JP | 2003-298096 | 10/2003 |
| JP | 2005235971 | 9/2005 |
| KR | 10-1000495 | 12/2010 |
| KR | 10-1058399 | 8/2011 |
| KR | 10-1305088 | 10/2013 |
| TW | 201327873 | 7/2013 |
| TW | 201427064 | 7/2014 |
| WO | 2013/098720 | 7/2013 |

OTHER PUBLICATIONS

International Preliminary Report on Patentability dated Sep. 25, 2018 and English Translation of Written Opinion of the International Searching Authority dated Apr. 25, 2017 associated with International Application No. PCT/KR2017/001891.

* cited by examiner

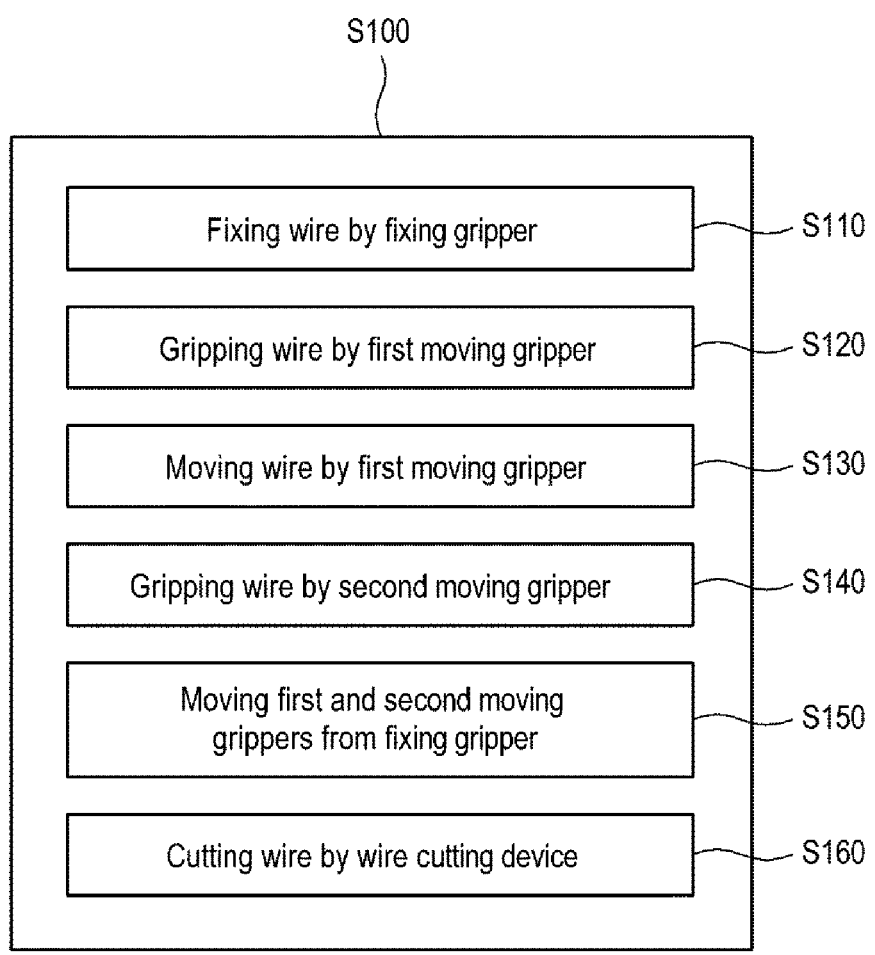

WIRE PROCESSING APPARATUS AND METHOD FOR TABBING APPARATUS

TECHNICAL FIELD

The present disclosure relates to a wire processing apparatus and method in a tabbing apparatus.

BACKGROUND

Today, human beings obtains most of the energy from oil, coal, nuclear power, natural gas, etc., but these fossil energy source and nuclear energy source are expected to be exhausted in the near future. Therefore, countries around the world have accelerated the research and development of renewable energy. Particularly, the sunlight power generation has drawn much attention, since electric power can be obtained from any sunlit place and does not generate pollution, unlike other electricity generation methods.

For sunlight power generation, a semiconductor device that converts solar energy into electrical energy is needed. Such a semiconductor device is referred to as a solar cell. In general, since a maximum voltage that can be generated by only one unit solar cell is about 0.5 V, unit solar cells interconnected in series should be used. A module in which unit solar cells are modularized by interconnecting them is referred to as a solar cell module.

Manufacturing processes for a solar cell module may be divided into a cell test process, a tabbing process, a lay-up process, a lamination process, and a module test process.

In a first process, i.e., the cell test process, solar cells having various electrical properties are tested and classified into several groups having a similar electrical property. In a second process, i.e., the tabbing process, several solar cells are connected in series by means of conductive ribbons. In a third process, i.e., the lay-up process, the solar cells that are connected in a line are arranged in a desired shape, and then low-iron reinforced glass, ethylene-vinyl acetate copolymer (EVA), a back sheet, etc. are stacked on them. In a fourth process, i.e., the lamination process, a resultant structure which is obtained in the form of a solar cell module by performing the lay-up process is processed to have durability and waterproofness by vacuum-compressing it at a high temperature. Finally, in the module test process, the finished solar cell module is tested to check whether it operates normally or not.

In this regard, the tabbing process in which several solar cells are connected by means of conductive ribbons is a key process among the manufacturing processes for a solar cell module. If the conductive ribbons are not appropriately bonded to the cells, the performance and quality of the whole solar cell module are deteriorated. The tabbing process is briefly described below. First, a plurality of conductive ribbons supplied from a reel are cut. Then, the conductive ribbons and solar cells are exposed to a high-temperature atmosphere while repeating that one sides of conductive ribbons are placed on a solar cell to lie on the cell and another solar cell is placed and stacked on the opposite sides of the conductive ribbons. The conductive ribbons are soldered to the cells under the high-temperature atmosphere, and thus, the plurality of cells are electrically connected by the conductive ribbons.

The background technology related to the present disclosure is disclosed in Korean registered patent publication No. 10-1058399.

SUMMARY

There has been known in the art a technique of using a conductive wire (hereinafter, simply referred to as a "wire"), which has a width (e.g., 1 mm or less) narrower than a width of the conductive ribbon, as a component for electrically connecting solar cells in order to minimize the current loss of the solar cells. The solar cells and the wire are placed on a conveyor of a conveying device. Then, the wire is soldered to the solar cells while the solar cells and the wire are conveyed together. The wire may move up and down and left and right. In a tabbing process using the wire, it is important to fix the wire until the wire is soldered to the solar cells.

The wire may be transferred onto the conveyor of the conveying device by a device that grips the wire. To avoid interference between the wire-gripping device and the solar cells, the wire-gripping device should release the wire and be moved back from the conveying device before the solar cell is disposed on the wire. That is, the solar cells can be supplied to the conveying device only when the delivery of the wire to the conveying device is completed. This increases the process time of the tabbing process.

The present disclosure provides a wire processing apparatus and method for a tabbing apparatus, which can achieve precise delivery and movement of a wire and can shorten a process time of a tabbing process.

A wire processing apparatus for a tabbing apparatus according to an exemplary embodiment of the present disclosure includes: a wire supplying device configured to cut a wire to a predetermined length; a cell conveying device, on which the wire and a cell are placed, and which is configured to convey the wire and the cell in a conveyance direction; and a wire transferring device configured to receive the wire from the wire supplying device and to deliver the wire to the cell conveying device. The cell is placed on the wire in the state where the wire transferring device grips the wire placed on the cell conveying device.

In an embodiment, the wire supplying device includes: a fixing gripper configured to fix the wire; a moving gripper configured to grip the wire and to move the wire in the state where the fixing gripper releases the wire; and a wire cutting device positioned between the fixing gripper and the moving gripper and configured to cut the wire.

In an embodiment, the fixing gripper includes: a fixing support portion on which the wire is placed; a fixing grip portion disposed above the fixing support portion and configured to press the wire toward the fixing support portion; and an elevating unit configured to move up and down the fixing grip portion.

In an embodiment, the wire supplying device further includes a stretching device configured to apply tension to the wire which is fixed to the fixing gripper.

In an embodiment, the stretching device includes: a moving support portion on which the wire is placed; a moving grip portion disposed above the moving support portion and configured to press the wire toward the moving support portion; an elevating unit configured to move up and down the moving grip portion; and a stretching movement unit configured to move the moving support portion in a direction away from the fixing gripper.

In an embodiment, the moving gripper includes: a wire gripping unit configured to grip the wire; and a gripper moving unit configured to move the wire gripping unit such that the wire gripping unit gets close to or is spaced apart from the fixing gripper.

In an embodiment, the moving gripper further includes an elevating unit configured to move up and down the wire gripping unit.

In an embodiment, the moving gripper includes: a first moving gripper which is disposed apart from the fixing gripper and is configured to be movable and to grip the wire;

and a second moving gripper which is positioned between the fixing gripper and the first moving gripper and is configured to be movable and to grip the wire.

In an embodiment, the wire transferring device includes: a first transfer gripper unit configured to grip a rear end portion of the wire; a second transfer gripper unit disposed apart from the first transfer gripper unit and configured to grip a front end portion of the wire; and a transfer gripper transporting unit configured to transport the first transfer gripper unit and the second transfer gripper unit. The transfer gripper transporting unit moves the first transfer gripper unit and the second transfer gripper unit such that the cell enters between the first transfer gripper unit and the second transfer gripper unit.

In an embodiment, the first transfer gripper unit includes a transfer gripper fixing portion, a first transfer gripper, a second transfer gripper and a gap adjusting device. The transfer gripper fixing portion is fixed to the transfer gripper transporting unit. The first transfer gripper includes: a first gripper movement portion movably coupled to the transfer gripper fixing portion; a first cell entering portion protruding from the first gripper movement portion and forming, on a top side of the first cell entering portion, a space into which a portion of the cell enters; and a first wire contact portion formed in the first cell entering portion. The second transfer gripper includes: a second gripper movement portion movably coupled to the transfer gripper fixing portion; a second cell entering portion protruding from the second gripper movement portion and forming, on a top side of the second cell entering portion, a space into which a portion of the cell enters; and a second wire contact portion formed in the second cell entering portion and disposed opposite to the first wire contact portion. The gap adjusting device is configured to adjust a gap between the first wire contact portion of the first transfer gripper and the second wire contact portion of the second transfer gripper.

In an embodiment, the gap adjusting device includes a first gripper moving unit configured to move the first transfer gripper such that the first wire contact portion is moved toward the second wire contact portion.

In an embodiment, the gap adjusting device further includes a second gripper moving unit configured to move the second transfer gripper such that the second wire contact portion is moved toward the first wire contact portion.

In an embodiment, when the first wire contact portion is moved toward the second wire contact portion, the first transfer gripper interferes with the transfer gripper fixing portion at a predetermined position to be stopped.

In an embodiment, a magnitude of a force with which the first gripper moving unit presses the first transfer gripper is greater than a magnitude of a force with which the second gripper moving unit presses the second transfer gripper.

In an embodiment, the transfer gripper transporting unit includes a horizontal movement unit configured to move the first transfer gripper unit and the second transfer gripper unit in a horizontal direction.

In an embodiment, the horizontal movement unit includes: a horizontal transport unit configured to move the first transfer gripper unit and the second transfer gripper unit by the same displacement; and a gap adjusting unit configured to adjust a gap between the first transfer gripper unit and the second transfer gripper unit.

In an embodiment, the cell conveying device includes a conveying belt having a placement surface on which the wire and the cell are placed. The conveying belt includes an inclined portion which does not interfere with the first cell entering portion of the first transfer gripper and the second cell entering portion of the second transfer gripper when the wire transferring device places the wire on the conveying belt.

Another aspect of the present disclosure provides a wire processing method for a tabbing apparatus. According to a wire processing method according to an exemplary embodiment, a wire which is cut to a predetermined length by a wire supplying device is supplied. A first transfer gripper unit and a second transfer gripper unit of a wire transferring device receive the wire from the wire supplying device by gripping a rear end portion and a front end portion of the wire respectively, and deliver the wire to a cell conveying device. When the wire is delivered to the cell conveying device, a cell enters between the first transfer gripper unit and the second transfer gripper unit and is placed on the wire.

In an embodiment, a fixing gripper of the wire supplying device fixes the wire. A first moving gripper of the wire supplying device grips the wire. The first moving gripper moves the wire in a direction away from the fixing gripper in the state where the fixing gripper releases the fixing of the wire. A second moving gripper of the wire supplying device, which is positioned between the first moving gripper and the fixing gripper, grips the wire. The first moving gripper and the second moving gripper are moved in the direction away from the fixing gripper. The wire is cut by a wire cutting device of the wire supplying device, which is positioned between the fixing gripper and the second moving gripper.

According to a wire processing apparatus for a tabbing apparatus according to an embodiment, when the wire is cut, the wire is firmly fixed and the breakage of the wire can be prevented. Further, when the transfer gripper delivers the wire to the cell conveying device, the interference between the transfer gripper and the solar cell can be prevented. Further, the transfer of the wire to the cell conveying device by the wire transferring device and the supply of the solar cell to the cell conveying device can be performed almost simultaneously, thereby shortening the process time of the tabbing process.

BRIEF DESCRIPTION OF THE DRAWINGS

FIG. 15 is a block diagram showing a detailed example of a step of supplying a wire.

DETAILED DESCRIPTION

Figure 1:
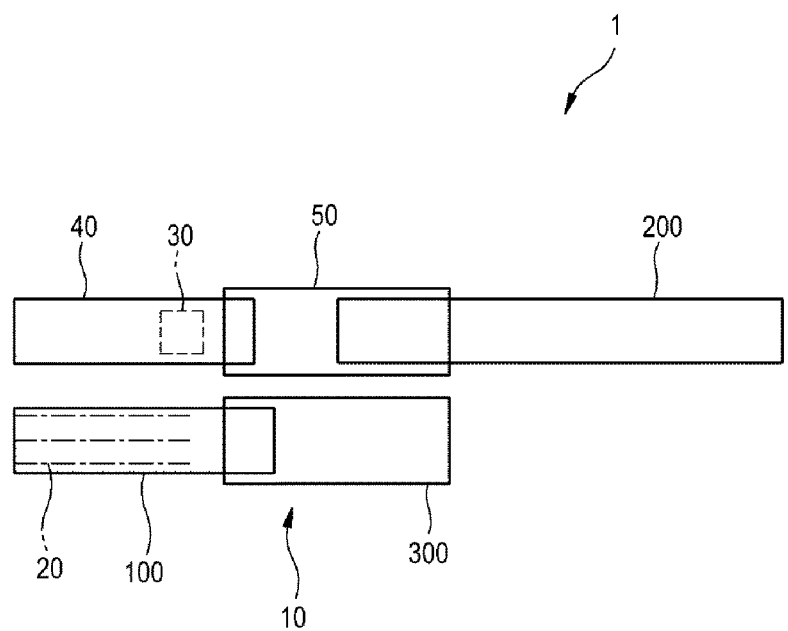
FIG. 1 schematically shows an example of a tabbing apparatus and a wire processing apparatus for a tabbing apparatus according to an embodiment.

Hereinafter, descriptions are made as to embodiments of a wire processing apparatus for a tabbing apparatus according to the present disclosure with reference to the accompanying drawings. The thicknesses of the lines, the sizes of the components, or the like shown in the accompanying drawings may be exaggerated for clarity and convenience of explanation. Further, it should be understood that two-dot chain lines shown in the accompanying drawings omit some of the parts that have the same configuration and are to be shown repeatedly. The specific terms used in the present disclosure are defined in consideration of functions in the present disclosure, but may be differently defined according to the intention or custom of a user or an operator. Thus, the terms used herein should be defined based on the whole context of the present disclosure FIG. 1 schematically shows an example of a tabbing apparatus and a wire processing apparatus of the tabbing apparatus according to an embodiment of the present disclosure. Referring to FIG. 1, a tabbing apparatus 1 may include: a cell supplying device 40 which is configured to supply a solar cell (hereinafter, simply referred to as a "cell"), a cell transferring device 50; and a wire processing apparatus 10 for the tabbing apparatus according to an embodiment. The wire processing apparatus 10 for the tabbing apparatus according to the embodiment (hereinafter, simply referred to as a "wire processing apparatus") includes a wire supplying device 100, a cell conveying device 200 and a wire transferring device 300. According to the wire processing apparatus 10 according to an embodiment, the wire 20 which interconnects the cells is cut to a predetermined length by the wire supplying device 100. The wire transferring device 300 receives the cut wire 20 from the wire supplying device 100 and delivers the received wire 20 to the cell conveying device 200 in a stable and accurate manner. The cut wire 20 and the cell 30 are placed on the cell conveying device 200. The cell conveying device 200 conveys the wire 20 and the cell 30 in a conveyance direction. The tabbing apparatus 1 may include a soldering device which is positioned within or adjacent to the cell conveying device 200 and is configured to bond the wire 20 to the cell 30. The tabbing apparatus 1 performs a tabbing process of: disposing the wire 20, which is supplied through the wire processing apparatus 10, to the cell 30 which is delivered from the cell supplying device 40 by the cell transferring device 50; and bonding the wire 20 to the cell. FIG. 1 shows three wires 20 in the wire supplying device 100, but the number of the wires 20 shown in FIG. 1 is merely illustrative.

Figure 2:
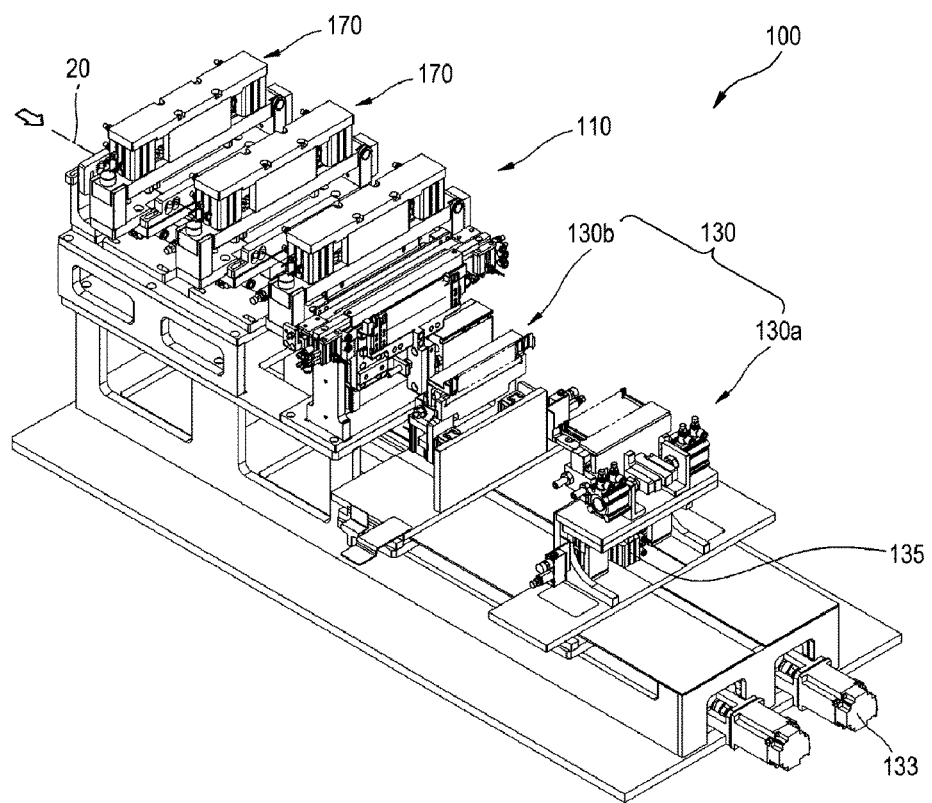
FIG. 2 schematically shows a wire supplying device in a wire processing apparatus according to an embodiment.

FIG. 2 schematically shows a wire supplying device in a wire processing apparatus according to an embodiment. Referring to FIG. 2, in this embodiment, the wire supplying device 100 includes a fixing gripper 110, a moving gripper 130 and a wire cutting device 150 (see FIG. 3). The wire supplying device 100 cuts the wire 20 to the predetermined length.

Figure 3:
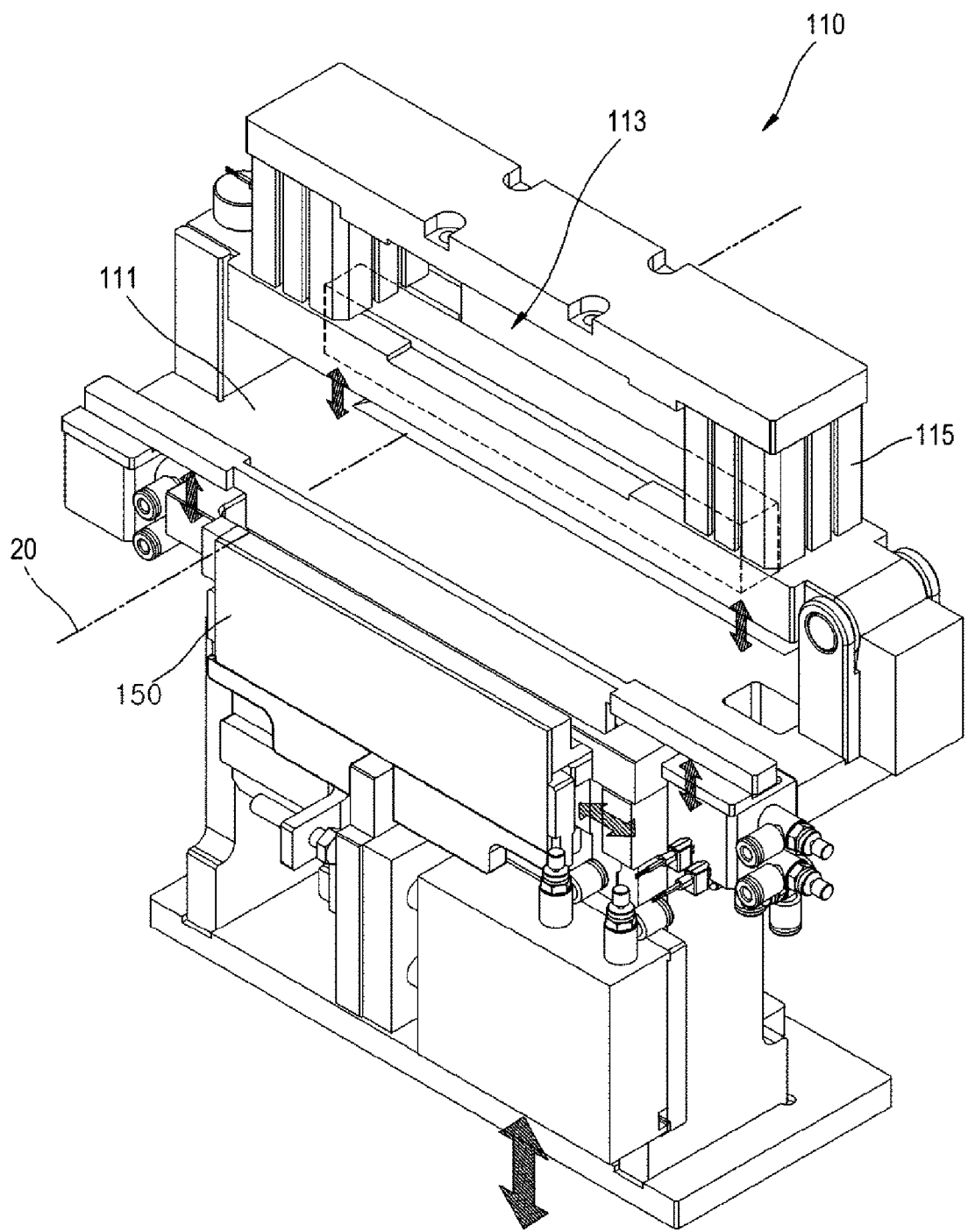
FIG. 3 schematically shows a fixing gripper in the wire supplying device shown in FIG. 2.

FIG. 3 schematically shows the fixing gripper in the wire supplying device shown in FIG. 2. Referring to FIG. 3, the fixing gripper 110 fixes the wire 20 by applying pressure to the wire 20 (by pressing the wire). Therefore, the wire 20 can be cut accurately. In this embodiment, the fixing gripper 110 includes a fixing support portion 111, a fixing grip portion 113 and an elevating unit 115. The fixing gripper 110 fixes the wire 20 when necessary during the operation of the wire processing apparatus.

The wire 20 is placed on the fixing support portion 111. The fixing support portion 111 has a support surface on which the wire 20 can be placed. The support surface of the fixing support portion 111 includes a horizontal surface which extends along an arrangement direction of a plurality of the wires 20, i.e., in a direction orthogonal to the movement direction of the wire 20.

The fixing grip portion 113 is disposed at one side of the fixing support portion 111, for example, above the fixing support portion 111. The fixing grip portion 113 presses the wire 20 downward toward the fixing support portion 111, thereby fixing the wire 20 between the fixing support portion 111 and the fixing grip portion 113.

The elevating unit 115 moves up and down the fixing grip portion 113. The elevating unit 115 moves the fixing grip portion 113 toward the fixing support portion 111, fixing the wire 20. As the elevating unit 115 spaces the fixing grip portion 113 from the fixing support portion 111, the fixing of the wire 20, which is fixed between the fixing grip portion 113 and the fixing support portion 111, is released.

In this embodiment, the elevating unit 115 includes a cylinder that is extended or retracted by means of pneumatic or hydraulic pressure. In other embodiment, the elevating unit 115 may move up and down the fixing grip portion 113 by using an electric motor, a rack and pinion, or the like.

Figure 4:
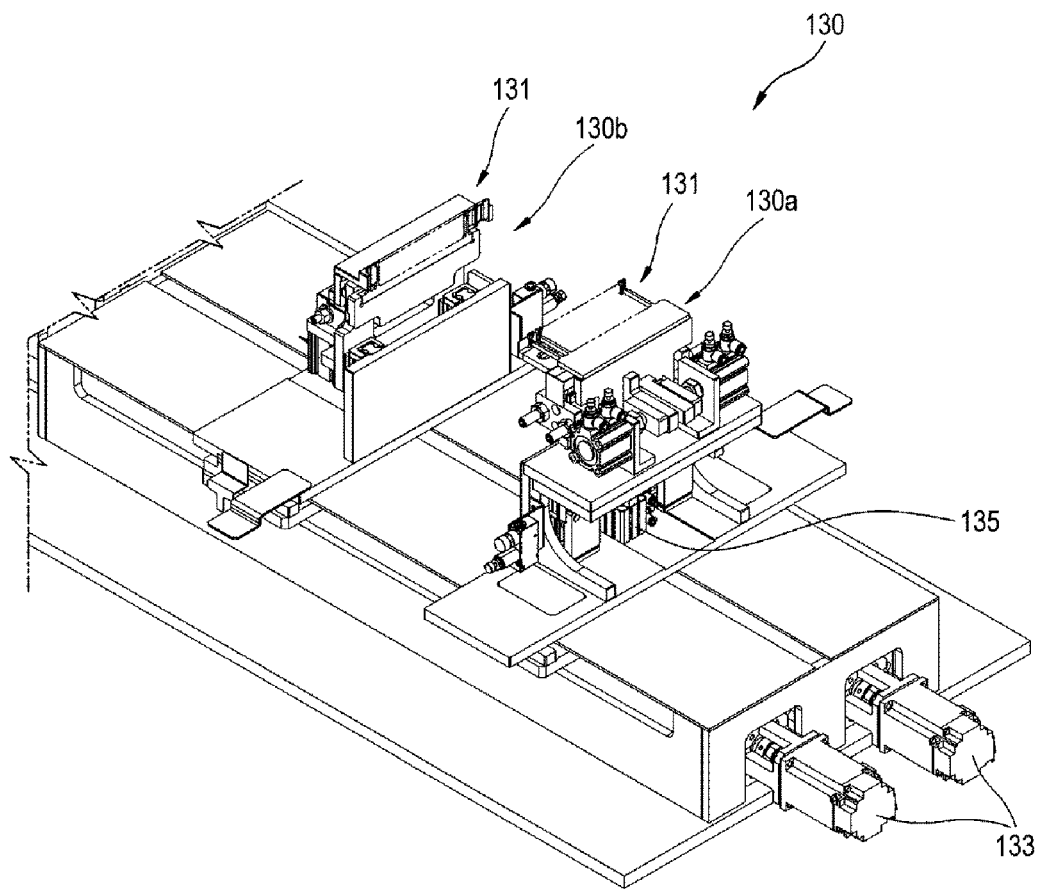
FIG. 4 is a perspective view schematically showing a moving gripper shown in FIG. 2.
Figure 5:
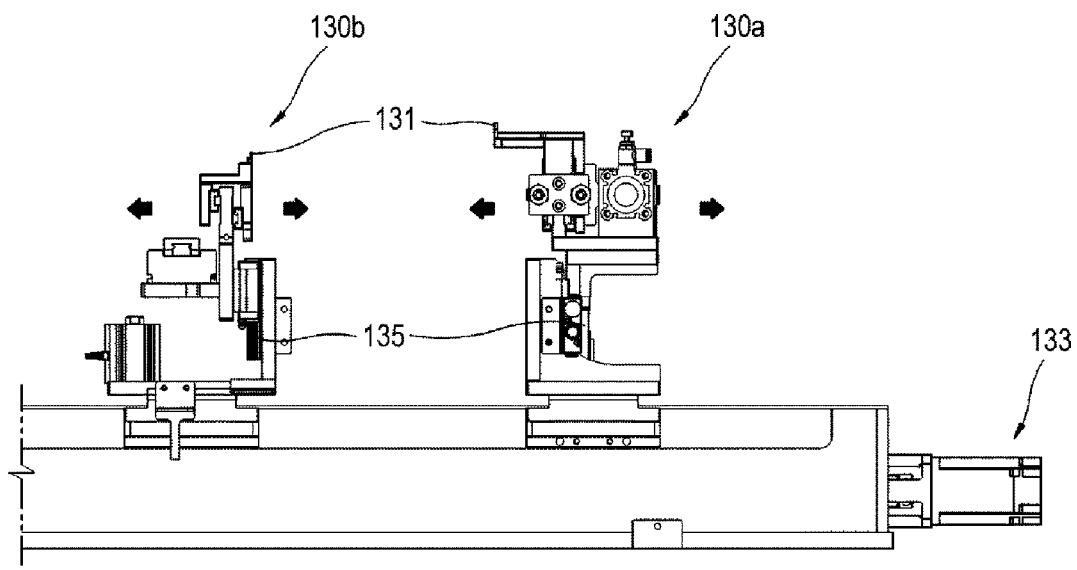
FIG. 5 is a front view schematically showing the moving gripper shown in FIG. 2.

FIG. 4 is a perspective view schematically showing the moving gripper shown in FIG. 2. FIG. 5 is a front view schematically showing the moving gripper shown in FIG. 2. FIGS. 6A to 6E show an example of the operation of the wire supplying device.

Referring to FIGS. 2 to 6E, in the state where the fixing gripper 110 releases the fixing of the wire 20, the moving gripper 130 moves the wire by pulling the wire 20 by a predetermined distance. The moving gripper 130 includes a wire gripping unit 131, a gripper moving unit 133, and an elevating unit 135.

The wire gripping unit 131 is formed in the form of tongs. The wire gripping unit 131 is configured to simultaneously grip a plurality of the wires 20 which protrude forward of the fixing gripper 110.

The gripper moving unit 133 moves the wire gripping unit 131 such that the wire gripping unit 131 gets close to or is spaced apart from the fixing gripper 110. A portion of the wire 20, which waits in the stretched state at the rear side of the fixing gripper 110, is moved forward of the fixing gripper 110. By doing so, the moving gripper 130 moves the wire 20 by the predetermined distance in the state where the wire 20 is released from the fixing gripper 110.

The elevating unit 135 moves up and down the wire gripping unit 131. The elevating unit 135 may include a base plate which supports the wire gripping unit 131, and an actuator such as a cylinder which provides a force for moving the base plate up and down.

The wire gripping unit 131 positioned below the wire 20 is moved up by the operation of the elevating unit 135, and then is positioned so as to grip the wire 20. When the wire gripping unit 131 releases the gripping of the wire 20, the wire gripping unit 131 is moved down to an initial position by the operation of the elevating unit 135.

In the wire processing apparatus according to embodiments, the wire supplying device 100 may include a plurality of the moving grippers 130 such that the wire 20 can be gripped at a plurality of locations. In this embodiment, the moving gripper 130 includes a first moving gripper 130a and a second moving gripper 130b. In other embodiment, the wire supplying device 100 may include three or more moving grippers 130 depending upon a length, stiffness, etc. of the wire 20. The first moving gripper 130a and the second moving gripper 130b are individually moved by the gripper moving unit 133 so as to get close to or to be spaced apart from the fixing gripper 110.

The first moving gripper 130a is positioned at one side of the fixing gripper 110, i.e., in front of the gripper 110 in a supply direction of the wire 20. In this embodiment, the first moving gripper 130a is positioned apart from the fixing gripper 110 in an extension direction of the wire 20 which is fixed by the fixing gripper 110. The first moving gripper 130a grips a plurality of the wires 20 at the same time and is movable in the extension direction of the wire 20 or in a direction opposite to the extension direction.

The second moving gripper 130b is positioned between the first moving gripper 130a and the fixing gripper 110. In this embodiment, the second moving gripper 130b is positioned apart from the fixing gripper 110 in the extension direction of the wire 20 which is fixed to the fixing gripper 110. Further, the second moving gripper 130b is positioned between the fixing gripper 110 and the first moving gripper 130a, and grips and supports the wire 20 together with the first moving gripper 130a.

In this embodiment, the first moving gripper 130a and the second moving gripper 130b are positioned apart from each other, and grip the wire 20 respectively. Accordingly, the first moving gripper 130a and the second moving gripper 130b can prevent the sagging of the wire 20 cut to the predetermined length, and can move, in vertical and horizontal directions, the wire 20 cut to the predetermined length.

Further, a space, into which a first transfer gripper unit 310 or a second transfer gripper unit 330 of the wire transferring device 300 can enter, is secured between the first moving gripper 130a and the fixing gripper 110. Further, during the movement of the wire 20, the wire 20 is prevented from being bent or damaged.

The wire cutting device 150 is positioned between the fixing gripper 110 and the moving gripper 130 and cuts the wire 20 to the predetermined length. The wire cutting device 150 adjoins or is disposed adjacent to the fixing gripper 110 so that the wire 20 can be cut to a length corresponding to the movement distance of the moving gripper 130.

When the wire cutting device 150 operates, a portion of the wire 20, which is moved forward of of the fixing gripper 110 by a predetermined distance by the moving gripper 130, is cut. In this embodiment, the wire cutting device 150 includes a plurality of cutting blades, and can cut a plurality of the wires 20 at the same time.

Figure 6A:
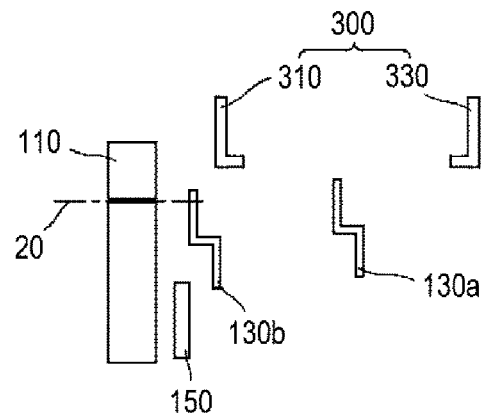
FIGS. 6A to 6E show an example of the operation of the wire supplying device.
Figure 6B:
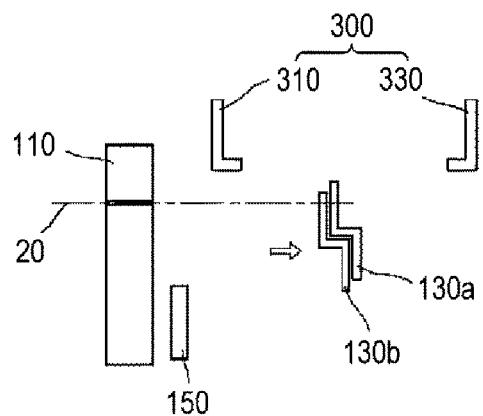
Figure 6C:
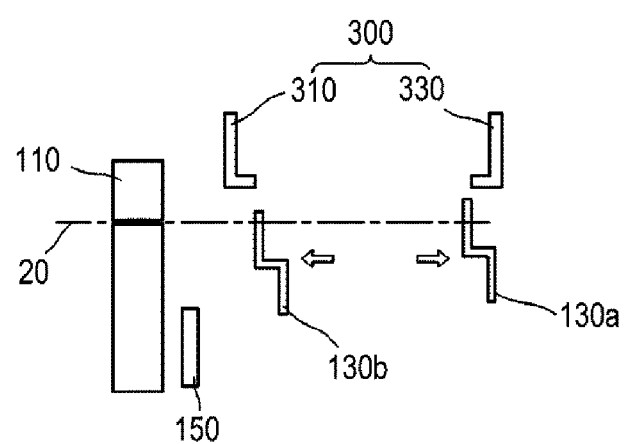
Figure 6D:
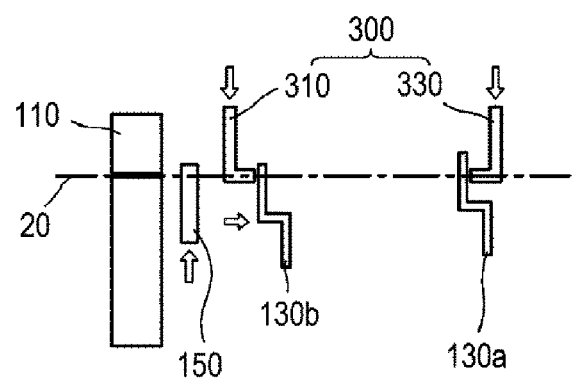
Figure 6E:
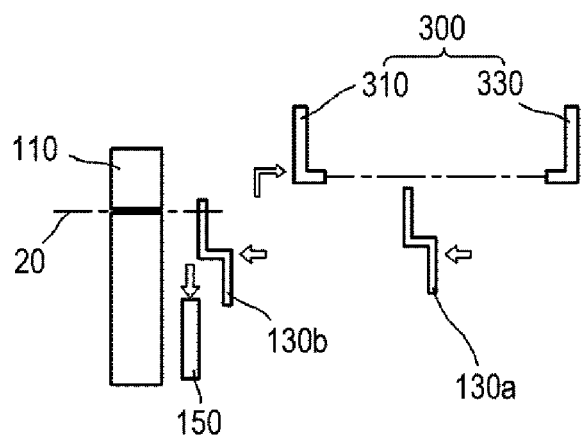

In this embodiment, as shown in FIGS. 6C and 6D, if the first moving gripper 130a and the second moving gripper 130b grip the wire 20, the wire cutting device 150 operates between the fixing gripper 110 and the second moving gripper 130b and cuts the wire 20.

If the wire 20 is cut, then the first moving gripper 130a and the second moving gripper 130b are moved so as to be spaced apart from the fixing gripper 110, thereby securing an entry space which permits a gripper of the wire transferring device 300 (specifically, the first transfer gripper unit 310) to enter between the fixing gripper 110 and the second moving gripper 130b.

Figure 7:
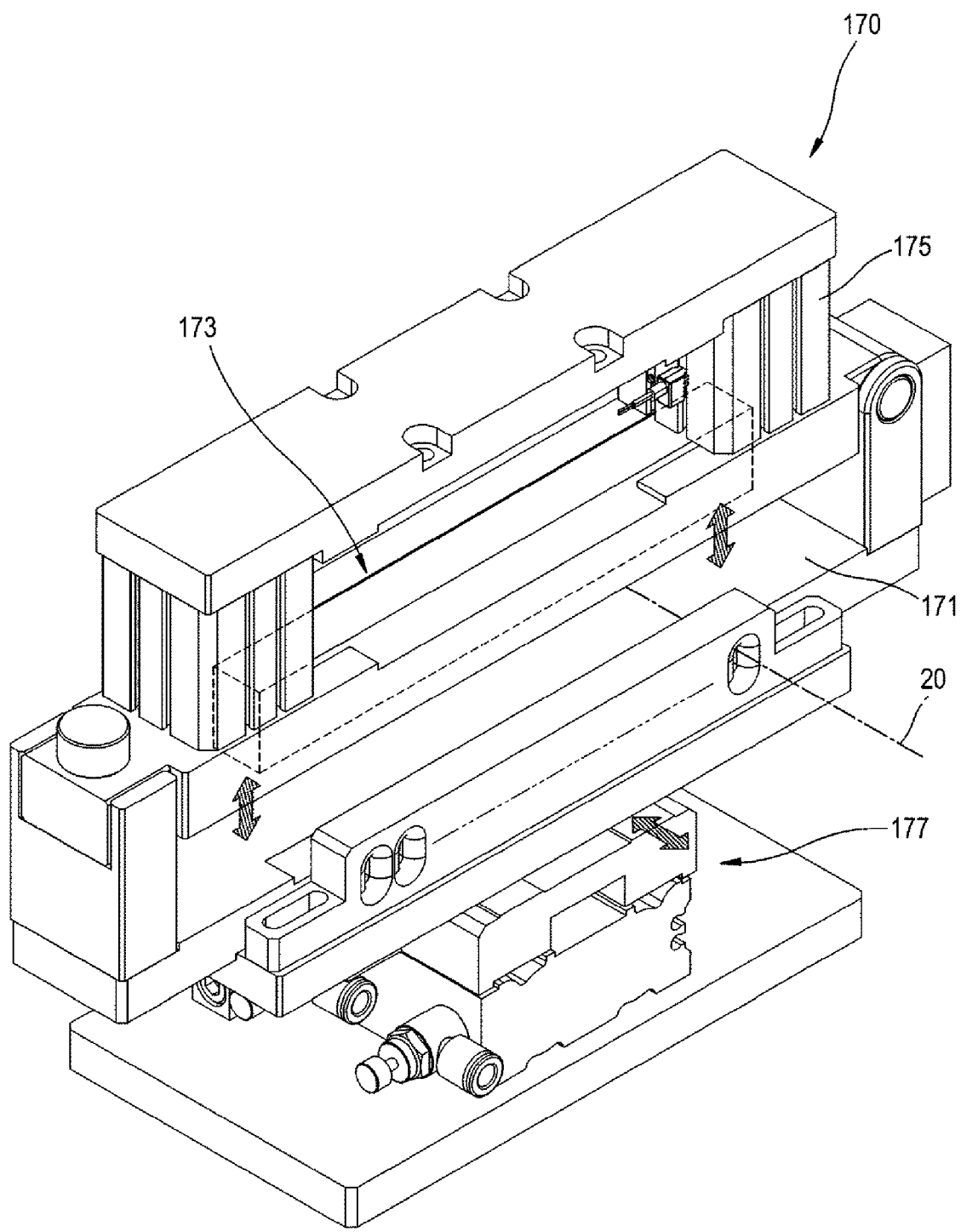
FIG. 7 schematically shows a stretching device of the wire supplying device.

FIG. 7 schematically shows a stretching device of the wire supplying device. Referring to FIGS. 2 and 7, in this embodiment, the wire supplying device 100 further includes a stretching device 170. The stretching device 170 applies tension to the wire 20 gripped by the fixing gripper 110. In this embodiment, the stretching device 170 includes a moving support portion 171, a moving grip portion 173, an elevating unit 175 and a stretching movement unit 177.

The wire 20 is placed on the moving support portion 171. The moving support portion 171 has a support surface on which the wire 20 can be placed. The moving grip portion 173 is disposed at one side of the moving support portion 171, specifically above the moving support portion 171 and presses the wire 20 toward the moving support portion 171. The elevating unit 175 moves up and down the moving grip portion 173.

The stretching movement unit 177 moves, in a horizontal direction, the moving support portion 171, more specifically, an assembly which consists of the moving support portion 171, the moving grip portion 173 and the elevating unit 175, so that the moving support portion or the assembly can be spaced apart from or get close to the fixing gripper 110.

As the elevating unit 175 is driven to move down, the moving grip portion 173 is moved down toward the moving support portion 171 and comes into contact with the wire 20. Thereafter, as the moving support portion 171 is moved to be spaced apart from the fixing gripper 110 in the horizontal direction by the stretching movement unit 177, the tension is applied to the wire 20.

In the state where the wire 20 is fixed by the fixing gripper 110, the elevating unit 175 and the stretching movement unit 177 are sequentially operated. Therefore, due to the aforementioned action, a portion of the wire 20, which is located at the rear of the fixing gripper 110, becomes stretched without being bent.

After the wire 20 is stretched, the elevating unit 175 is moved up, and the stretching movement unit 177 is returned to its original position. Then, the assembly, which consists of the moving support portion 171, the moving grip portion 173 and the elevating unit 175, is returned to the initial position.

The moving grip portion 173 performs an action of linearizing the wire 20 without being bent of the wire by sweeping or rubbing the surface of the wire 20 in a direction away from the fixing gripper 110 while the moving grip portion 173 is moved above the wire 20 along an approximately rectangular track by the operation of the elevating unit 175 and the stretching movement unit 177.

Figure 8:
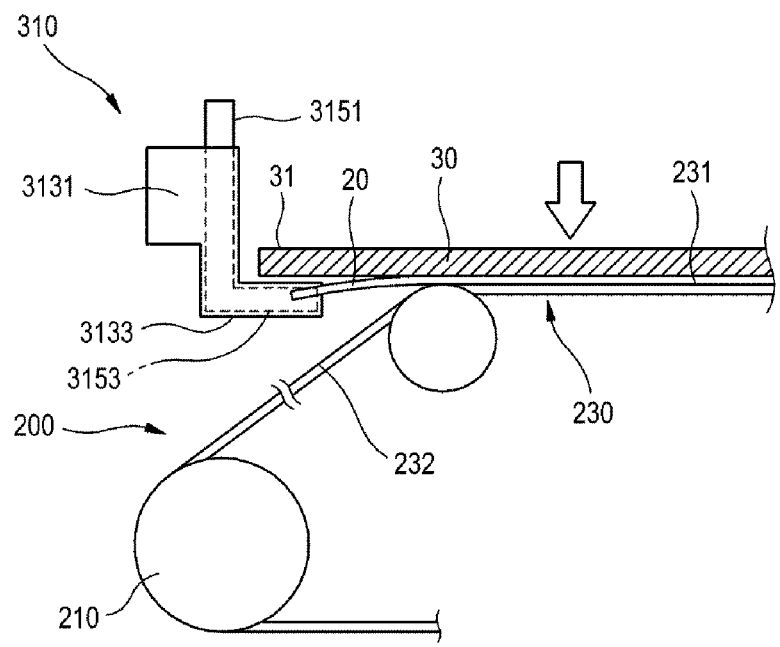
FIG. 8 shows an example where a wire is delivered to a cell conveying device by a wire transferring device in a wire processing apparatus according to an embodiment and a cell is placed on the wire.

FIG. 8 shows an example where a wire is delivered to a cell conveying device by a wire transferring device in a wire processing apparatus according to an embodiment and a cell is placed on the wire. Referring to FIGS. 1 and 8, the cell conveying device 200 is configured such that the wire 20 and the cell 30 are placed on the cell conveying device. The cell conveying device 200 is configured to convey the wire 20 and the cell 30 in the conveyance direction. The cell conveying device 200 conveys the cell 30 and the wire 20 separately or conveys the cell 30 and the wire 20 in the stacked state. In this embodiment, the cell conveying device 200 includes a drive unit 210 and a conveying belt 230.

The drive unit 210 includes an electric motor and a driving pulley. The drive unit 210 generates a rotational force to rotate the conveying belt 230. The conveying belt 230 has a placement surface 231 on which a plurality of the cells 30 and the wires 20 are placed. The conveying belt 230 is rotated in an endless track manner by the drive unit 210 in the state where the cells 30 and the wires 20 are stacked, thereby conveying the cells 30 and the wires 20 in the conveyance direction. The conveying belt 230 includes an inclined portion 232 at a rear end portion of the cell conveying device 200. The inclined portion 232 permits a portion of the first transfer gripper unit 310 of the wire transferring device 300 (e.g., a first cell entering portion 3133 of a first transfer gripper 313 and a second cell entering portion 3153 of a second transfer gripper 315) to be positioned at approximately the same height as the placement surface 231 of the conveying belt 230. That is, when the wire transferring device 300 places the wire 20 on the placement surface 231 of the conveying belt 230, the inclined portion 232 of the conveying belt 230 does not interfere with the first cell entering portion 3133 of the first transfer gripper 313 and the second cell entering portion 3153 of the second transfer gripper 315.

In this embodiment, the cell conveying device 200 has a conveyor structure on which the cells 30 and the wires 20 can be placed in the stacked state. However, as long as the cell conveying device 200 can convey the cells 30 and the wires 20 in the stacked state, the cell conveying device 200 is not limited to a specific structure and shape.

Figure 9:
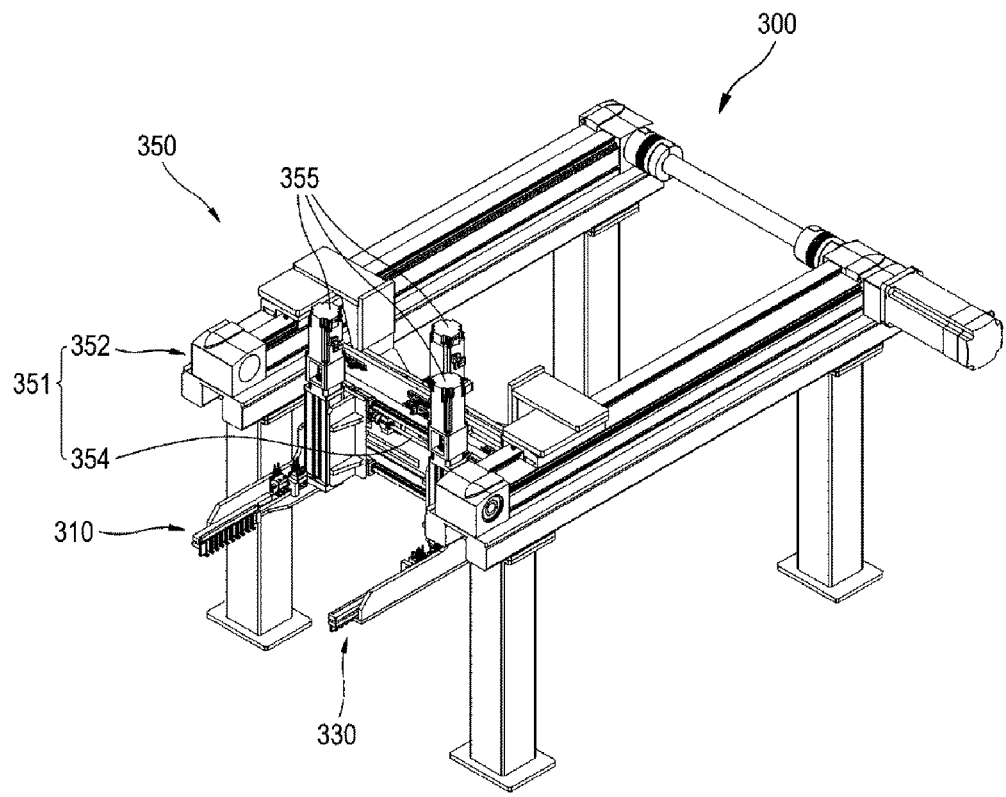
FIG. 9 is a perspective view showing a wire transferring device in a wire processing apparatus according to an embodiment.

FIG. 9 is a perspective view showing a wire transferring device in a wire processing apparatus according to an embodiment. Referring to FIGS. 1, 2 and 9, the wire transferring device 300 delivers the wire 20, which is received from the wire supplying device 100, to the cell conveying device 200. Further, the wire processing apparatus 10 is configured such that the cell 30 is placed on the wire 20 or the cell conveying device 200 in the state where the wire transferring device 300 places the wire 20 on the cell conveying device 200 and grips the wire 20.

That is, in this embodiment, the wire transferring device 300 delivers the wire 20, which is cut to the predetermined length in the wire supplying device 100, to the cell conveying device 200. Further, in the state where the wire transferring device 300 grips the wire 20, the cell 30 is placed on the wire 20 or on the cell conveying device 200. Therefore, the time required for transferring the wire 20 and the cell 30 can be shortened.

Figure 10:
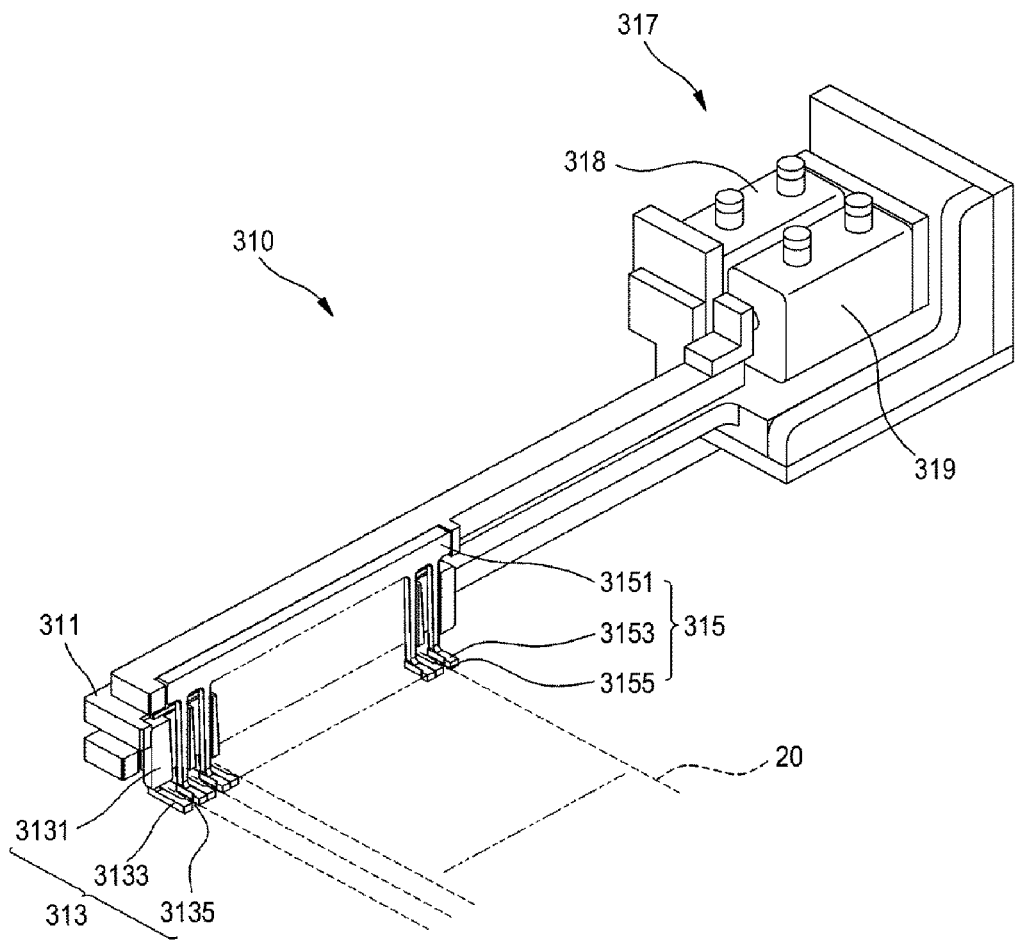
FIG. 10 is a perspective view schematically showing a first transfer gripper unit of the wire transferring device shown in FIG. 9.
Figure 11:
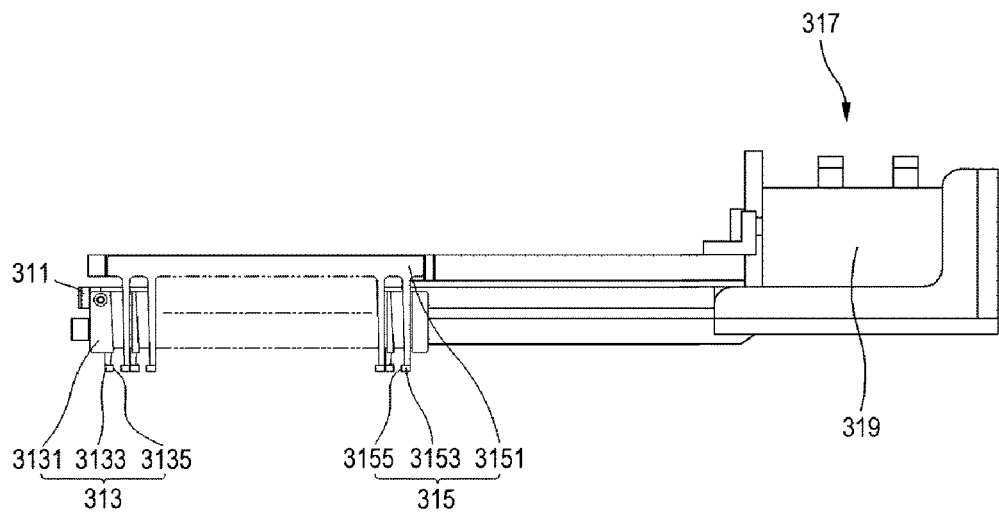
FIG. 11 is a front view showing the first transfer gripper unit shown in FIG. 10
Figure 12:
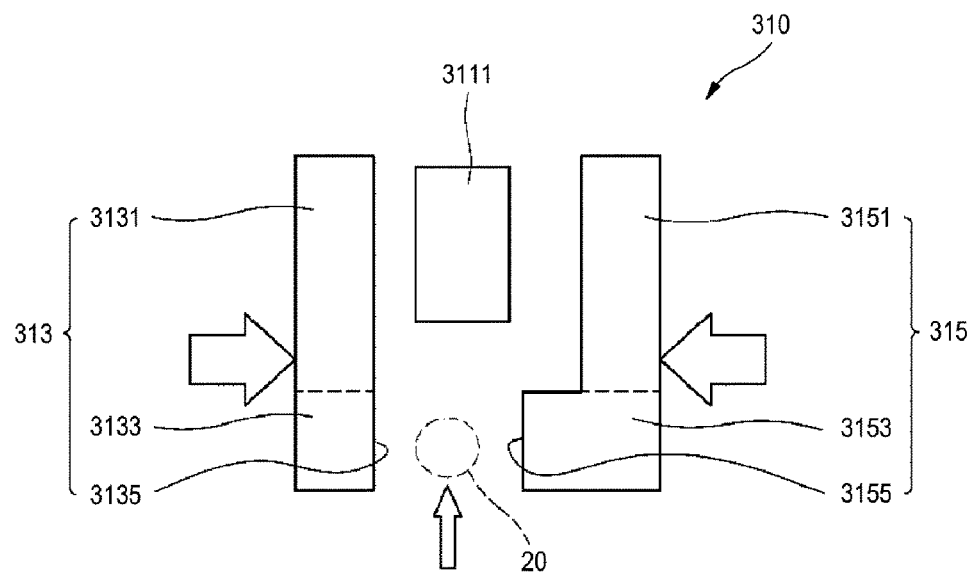
FIG. 12 schematically shows the configuration of the first transfer gripper unit shown in FIG. 10.
Figure 13A:
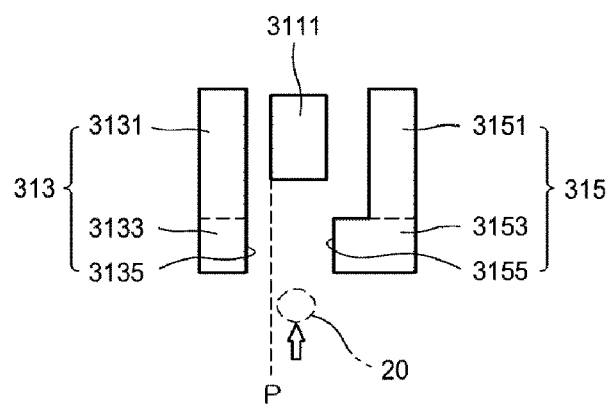
FIGS. 13A to 13C show an example of the operation of the first transfer gripper unit.
Figure 13B:
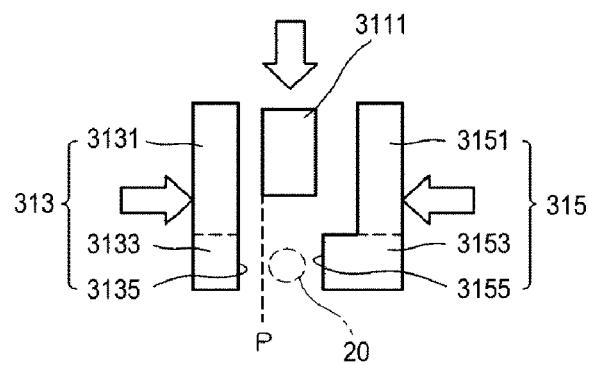
Figure 13C:
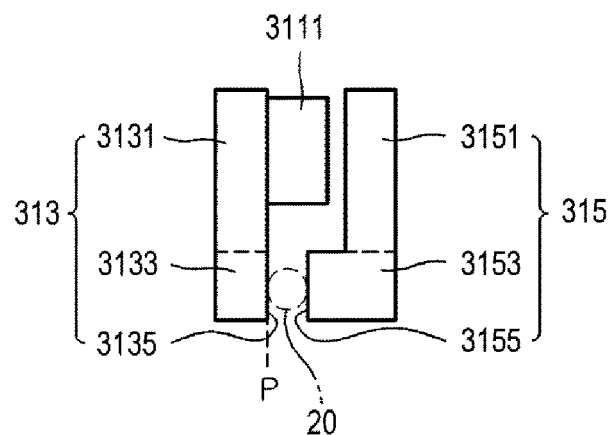

FIG. 10 is a perspective view schematically showing a first transfer gripper unit of the wire transferring device shown in FIG. 9. FIG. 11 is a front view showing the first transfer gripper unit shown in FIG. 10. FIG. 12 schematically shows the configuration of the first transfer gripper unit shown in FIG. 10. FIGS. 13A to 13C show an example of the operation of the first transfer gripper unit.

Referring to FIGS. 9 to 13C, in this embodiment, the wire transferring device 300 includes a first transfer gripper unit 310, a second transfer gripper unit 330 and a transfer gripper transporting unit 350.

The first transfer gripper unit 310 grips a rear end portion of the wire 20 cut to the predetermined length. In this regard, the rear end portion of the wire 20 means an end portion which is located at a rear side with reference a direction in which the wire 20 is transported by the wire supplying device 100.

In this embodiment, the first transfer gripper unit 310 includes a transfer gripper fixing portion 311, a first transfer gripper 313, a second transfer gripper 315 and a gap adjusting device 317.

The transfer gripper fixing portion 311 is fixed to the transfer gripper transporting unit 350 and is moved by the transfer gripper transporting unit 350.

The first transfer gripper 313 is movably coupled to one side of the transfer gripper fixing portion 311 and grips the rear end portion of the wire 20 together with the second transfer gripper 315. In this embodiment, the first transfer gripper 313 includes a first gripper movement portion 3131, a first cell entering portion 3133 and a first wire contact portion 3135. The second transfer gripper 315 is movably coupled to the other side of the transfer gripper fixing portion 311 and grips the rear end portion of the wire 20 together with the first transfer gripper 313. In this embodiment, the second transfer gripper 315 includes a second gripper movement portion 3151, a second cell entering portion 3153 and a second wire contact portion 3155.

The first gripper movement portion 3131 is movably coupled to the transfer gripper fixing portion 311. The first gripper movement portion 3131 is reciprocated by the gap adjusting device 317 in an arrangement direction of the wires 20, that is, in a direction orthogonal to a longitudinal direction of the wire 20.

As the first gripper movement portion 3131 is moved, the first cell entering portion 3133 and the first wire contact portion 3135, which are connected to the first gripper movement portion 3131, are moved simultaneously. The first wire contact portion 3135 can grip the wire 20 between the first wire contact portion 3135 and the second wire contact portion 3155 by pressing the wire 20 positioned between the first wire contact portion 3135 and the second wire contact portion 3155. Further, the first wire contact portion 3135 can release the movement restriction of the wire 20 by being spaced apart from the wire 20 gripped between the first wire contact portion 3135 and the second wire contact portion 3155.

The first cell entering portion 3133 protrudes from the first gripper movement portion 3131. Therefore, the first cell entering portion 3133 forms, on the top side thereof, a space into which the cell 30 enters, or in which a portion of the cell 30 (e.g., an edge portion 31 of the cell 30 as shown in FIG. 8) is positioned. In this embodiment, when the first transfer gripper 313 is viewed in a direction orthogonal to the conveyance direction of the wire 20, the first gripper movement portion 3131 and the first cell entering portion 3133 form an L-like shape.

The first wire contact portion 3135 is formed in the first cell entering portion 3133 positioned at a right side in the above-described L-like shape. According to such a first transfer gripper 313, the first transfer gripper is provided with a space which permits the cell 30 to enter into the top side of the first cell entering portion 3133 in the state where the first transfer gripper 313 grips the wire 20.

The first wire contact portion 3135 is formed in the first cell entering portion 3133 and is moved together with the first cell entering portion 3133. As shown in FIG. 11, the first wire contact portion 3135 is positioned opposite to the second wire contact portion 3155. The first wire contact portion 3135 is moved in a direction of narrowing or widening a gap between the first wire contact portion 3135 and the second wire contact portion 3155 such that the wire 20 positioned between the first wire contact portion 3135 and the second wire contact portion 3155 is gripped or released.

The second gripper movement portion 3151 is movably coupled to the transfer gripper fixing portion 311. The second gripper movement portion 3151 is reciprocated by the gap adjusting device 317 in the arrangement direction of the wires 20, that is, in the direction orthogonal to the longitudinal direction of the wire 20.

As the second gripper movement portion 3151 is moved, the second cell entering portion 3153 and the second wire contact portion 3155, which are connected to the second gripper movement portion 3151, are moved simultaneously. The second wire contact portion 3155 can grip the wire 20 between the first wire contact portion 3135 and the second wire contact portion 3155 by pressing the wire 20 positioned between the first wire contact portion 3135 and the second wire contact portion 3155. Further, the second wire contact portion 3155 can release the movement restriction of the wire 20 by being spaced apart from the wire 20 gripped between the first wire contact portion 3135 and the second wire contact portion 3155.

The second cell entering portion 3153 protrudes from the second gripper movement portion 3151. Therefore, the second cell entering portion 3153 forms, on the top side thereof, a space into which the cell 30 enters, or in which the portion of the cell 30 is positioned. In this embodiment, when the second transfer gripper 315 is viewed in the direction orthogonal to the conveyance direction of the wire 20, the second gripper movement portion 3151 and the second cell entering portion 3153 form an L-like shape.

The second wire contact portion 3155 is formed in the second cell entering portion 3153 positioned at a right side in the above-described L-like shape. According to such second transfer gripper 315, the second transfer gripper 315 is provided with a space which permits the cell 30 to enter into the top side of the second cell entering portion 3153 in the state where the wire 20 is gripped.

The second wire contact portion 3155 is formed in the second cell entering portion 3153 and is moved together with the second cell entering portion 3153. As shown in FIG. 11, the second wire contact portion 3155 is positioned opposite to the first wire contact portion 3135. The second wire contact portion 3155 is moved in a direction of narrowing or widening the gap between the first wire contact portion 3135 and the second wire contact portion 3155 such that the wire 20 positioned between the first wire contact portion 3135 and the second wire contact portion 3155 is gripped or released.

Referring again to FIG. 8, when the cell 30 is placed on the wire 20 placed on the conveying belt 230 in the state of being gripped by the first and second transfer grippers 313, 315, the edge portion 31 of the cell 30 can enter the aforementioned spaces formed on the top sides of the first cell entering portion 3133 and the second cell entering portion 3155, and the rear end portion of the wire 20 can be positioned further forward than the edge portion 31 of the cell 30. Since the inclined portion 232 of the conveying belt 230 permits the first cell entering portion 3133 and the second cell entering portion 3155 to be located at approximately the same height as the placement surface 231 of the conveying belt 230, the wire 20 can be placed on the conveying belt 230 in the state where the first and second transfer grippers 313 and 315 grip the wire 20, and the cell 30 can be placed on the wire 20 placed on the conveying belt 230.

Thus, according to this embodiment, to place the cell 30 on the wire 20, the first transfer gripper unit 310 does not need to release the gripped wire 20. This is because the cell 30 does not interfere with the first transfer gripper unit 310 at all when the cell 30 is placed on the wire 20. Further, according to this embodiment, the first transfer gripper unit 310 does not need to be moved separately for purposes of securing a path for disposing the cell 30 on the conveying belt 230 of the cell conveying device 200. The cell 30 can be placed on the wire 20 or on the cell conveying device 200 without such movement of the first transfer gripper unit. Thus, since the wire processing apparatus 10 of the tabbing apparatus according to this embodiment can perform both the operation of transferring the wire 20 to the cell conveying device 200 and the operation of transferring the cell 30 to the wire 20. Therefore, the time required for transferring the wire 20 and the cell 30 can be shortened.

The gap adjusting device 317 adjusts the gap between the first wire contact portion 3135 of the first transfer gripper 313 and the second wire contact portion 3155 of the second transfer gripper 315, thereby allowing the wire 20 to be gripped between the first wire contact portion 3135 and the second wire contact portion 3155, or allowing the wire 20 gripped between the first wire contact portion 3135 and the second wire contact portion 3155 to be released. In this embodiment, the gap adjusting device 317 includes a pneumatic cylinder or a hydraulic cylinder to generate a driving force. The gap adjusting device 317 moves the first transfer gripper 313 or the second transfer gripper 315 in a direction approximately orthogonal to the longitudinal direction of the wire 20, thereby allowing the wire 20, which is positioned between the first wire contact portion 3135 of the first transfer gripper 313 and the second wire contact portion 3155 of the second transfer gripper 315, to be gripped therebetween or to be released therefrom.

In this embodiment, the gap adjusting device 317 includes at least one of a first gripper moving unit 318 and a second gripper moving unit 319.

The first gripper moving unit 318 moves the first transfer gripper 313 to adjust the gap between the first wire contact portion 3135 and the second wire contact portion 3155. In this embodiment, the first gripper moving unit 318 includes a pneumatic cylinder or a hydraulic cylinder. By the first gripper moving unit 318, the first wire contact portion 3135 is moved toward the second wire contact portion 3155, thereby gripping the wire 20 positioned between the first wire contact portion 3135 and the second wire contact portion 3155. The second gripper moving unit 319 moves the second transfer gripper 315 to adjust the gap between the first wire contact portion 3135 and the second wire contact portion 3155. In this embodiment, the second gripper moving unit 319 includes a pneumatic cylinder or a hydraulic cylinder. By the second gripper moving unit 319, the second wire contact portion 3155 is moved toward the first wire contact portion 3135, thereby gripping the wire 20 positioned between the first wire contact portion 3135 and the second wire contact portion 3155.

In this embodiment, when the first transfer gripper 313 is moved toward the second transfer gripper 315 by the first gripper moving unit 318, the first transfer gripper 313 interferes with the transfer gripper fixing portion 311 at a predetermined position P and the movement of the first transfer gripper 313 is stopped at the predetermined position P. Thus, the position where the first transfer gripper 313 grips the wire 20 is positioned at the predetermined position P. The transfer gripper fixing portion 311 includes a stopper 3111 (see FIGS. 13A to 13C), and the first transfer gripper 313 (specifically, the first gripper movement portion 3131) comes into contact with the stopper 3111 and the movement of the first transfer gripper 313 is stopped. The wire transferring device 300 can move the first transfer gripper unit 310 such that the stopper 3111 is positioned at the predetermined position P. Referring to FIG. 12 and FIGS. 13A to 13C, since the first transfer gripper unit 310 can be moved to the predetermined position P where the wire 20 is gripped, the operation of moving the wire 20 to the predetermined position P can be excluded and the process time of the tabbing process can be shortened.

Further, in this embodiment, the gap adjusting device 317 is configured such that the magnitude of a force, with which the first gripper moving unit 318 presses the first transfer gripper 313, is greater than the magnitude of a force with which the second gripper moving unit 319 presses the second transfer gripper 315. Therefore, the first transfer gripper 313 can finally grip the wire 20 at the predetermined position P regardless of moving speeds, initial positions and the like of the first transfer gripper 313 and the second transfer gripper 315.

That is, although the second transfer gripper 315 comes into contact with the wire 20 before the first transfer gripper 313 reaches the predetermined position P, the first transfer gripper 313 moves the second transfer gripper 315 together with the wire 20 until reaching the predetermined position P, and therefore the first transfer gripper 313 can finally grip the wire 20 at the predetermined position P.

The second transfer gripper unit 330 is disposed to be spaced apart from the first transfer gripper unit 310 and grips a front end portion of the wire 20. The wire transferring device 300 is configured to allow the cell 30 to enter between the first transfer gripper unit 310 and the second transfer gripper unit 330.

According to embodiments of the wire processing apparatus, the second transfer gripper unit 330 may have various shapes and configurations in the technical idea that the cell 30 can enter between the first transfer gripper unit 310 and the second transfer gripper unit 330 in the state where the first transfer gripper unit 310 and the second transfer gripper unit 330 grip the wire 20. For example, the second transfer gripper unit 330 may be formed in a shape corresponding to the shape of the first transfer gripper unit 310. That is, to correspond with the L-like shape of the first transfer gripper unit 310, the second transfer gripper unit 330 may be formed in a shape symmetrical to the L-like shape. In this case, the second transfer gripper unit 330 may grip the wire 20 at a left end portion thereof.

Further, as long as the cell 30 can enter between the first transfer gripper unit 310 and the second transfer gripper unit 330, the second transfer gripper unit 330 may be formed in an I-like shape. In this case, the second transfer gripper unit 330 may grip the wire 20 at a lower end portion thereof.

The transfer gripper transporting unit 350 transports the first transfer gripper unit 310 and the second transfer gripper unit 330. Further, the transfer gripper transporting unit 350 moves the first transfer gripper unit 310 and the second transfer gripper unit 330 so that the cell 30 can enter between the first transfer gripper unit 310 and the second transfer gripper unit 330. In this embodiment, the transfer gripper transporting unit 350 includes a horizontal movement unit 351 and a vertical movement unit 355.

The horizontal movement unit 351 moves the first transfer gripper unit 310 and the second transfer gripper unit 330 in the horizontal direction. In this embodiment, the horizontal movement unit 351 includes a horizontal transport unit 352 and a gap adjusting unit 354.

The horizontal transport unit 352 moves the first transfer gripper unit 310 and the second transfer gripper unit 330 by the same displacement in the state where the first transfer gripper unit 310 and the second transfer gripper unit 330 are spaced apart from each other by a predetermined distance. The horizontal transport unit 352 transports the first transfer gripper unit 310 and the second transfer gripper unit 330 to the wire supplying device 100 or transports the first transfer gripper unit 310 and the second transfer gripper unit 330 to the cell conveying device 200 in the state where the first transfer gripper unit 310 and the second transfer gripper unit 330 grip the wire 20 received from the wire supplying device 100.

The gap adjusting unit 354 adjusts a gap between the first transfer gripper unit 310 and the second transfer gripper unit 330. Specifically, a gap between the first transfer gripper unit 310 and the second transfer gripper unit 330 is adjusted by the gap adjusting unit 354 in order to prevent the first transfer gripper unit 310 and the second transfer gripper unit 330 from interfering with peripheral devices when the first transfer gripper unit 310 and the second transfer gripper unit 330 is moved to the wire supplying device 100. Further, when the first transfer gripper unit 310 and the second transfer gripper unit 330 receive the wire 20 from the wire supplying device 100, the gap between the first transfer gripper unit 310 and the second transfer gripper unit 330 is adjusted by the gap adjusting unit 354 to correspond to the length of the wire 20 cut to the predetermined length. Further, the gap between the first transfer gripper unit 310 and the second transfer gripper unit 330 is adjusted by the gap adjusting unit 354 so that the cell 30 can enter between the first transfer gripper unit 310 and the second transfer gripper unit 330.

Figure 14:
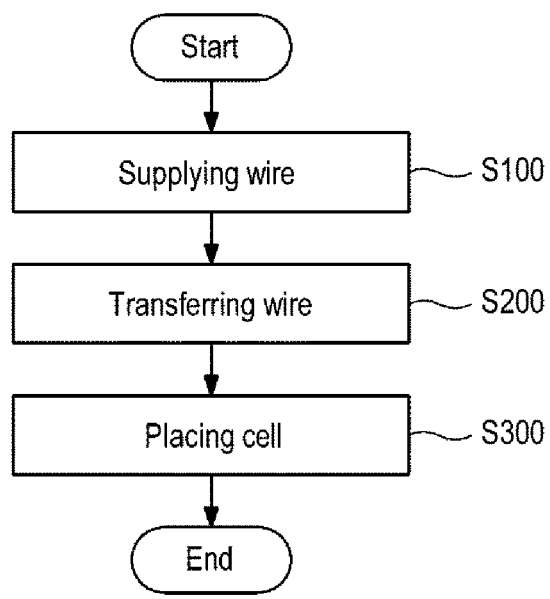
FIG. 14 is a flow chart showing a wire processing method for a tabbing apparatus according to an embodiment.

FIG. 14 is a flow chart showing an embodiment of a wire processing method for a tabbing apparatus. FIG. 15 is a block diagram showing a detailed example of a step of supplying a wire. Descriptions are made as to an embodiment of a wire processing method for a tabbing apparatus with reference to FIG. 1, FIGS. 6A to 6E, FIG. 8, FIGS. 13A to 13C, FIG. 14 and FIG. 15.

The wire processing method for a tabbing apparatus of this embodiment includes the steps of: supplying a wire (S100); transferring the wire (S200); and placing a cell (S300).

In the step of supplying the wire (S100), the wire supplying device 100 cuts the wire 20 to the predetermined length, thus manufacturing the wire 20 necessary for the tabbing process. In this embodiment, the step of supplying the wire (S100) may be performed by steps (S110, S120, S130, S140, S150, and S160) shown in FIG. 15.

Referring to FIG. 15, in step S110, the fixing gripper 110 of the wire supplying device 100 fixes the wire 20 by pressing the wire. In this step S110, the front end portion of the wire 20 fixed by the fixing gripper 110 is held by the fixing gripper 110 in the state where the front end portion protrudes forward of the fixing gripper 110.

In step S120, the first moving gripper 130a grips the wire 20 which protrudes from the fixing gripper 110. In other embodiment, the first moving gripper 130a may be moved toward the fixing gripper 110 to grip the wire 20. Further, in other embodiment, the second moving gripper 130b may grip the wire 20 and then may deliver the wire 20 to the first moving gripper 130a.

In step S120, the first moving gripper 130a grips the wire 20. Then, as shown by step S130, the fixing gripper 110 releases the fixing of the wire 20, and the first moving gripper 130a is moved by a predetermined distance in a direction away from the fixing gripper 110, increasing the extent of protrusion of the wire 20 from the fixing gripper 110.

In step S130, the wire 20 is moved by the predetermined distance in the direction away from the fixing gripper 110. Then, as shown by step S140, the second moving gripper 130b, which is positioned between the first moving gripper 130a and the fixing gripper 110, grips and supports the wire 20.

The wire 20 is gripped by the first moving gripper 130a and the second moving gripper 130b. Then, as shown by step S150, both the first moving gripper 130a and the second moving gripper 130b are moved at the same speed, and thus the second moving gripper 130b is spaced apart from the fixing gripper 110. Therefore, a space, into which the wire transferring device 300, specifically the first transfer gripper unit 310 enters, is secured between the fixing gripper 110 and the second moving gripper 130b.

The second moving gripper 130b is spaced apart from the fixing gripper 110. Then, as shown by step S160, the wire cutting device 150 is operated to cut the wire 20 at between the second moving gripper 130b and the fixing gripper 110.

The wire 20 is cut to the predetermined length by the above-described step S100 of supplying the wire. Then, as shown by step S200, the first transfer gripper unit 310 and the second transfer gripper unit 330 of the wire transferring device 300 receive the wire 20 from the wire supplying device 100 by gripping the opposing ends of the cut wire 20, and then deliver the wire 20 to the cell conveying device 200.

In step S300, the wire transferring device 300 places the wire 20 on the cell conveying device 200, and the cell transferring device 50 transfers the cell 30 to enter between the first transfer gripper unit 310 and the second transfer gripper unit 330, thereby placing the cell 30 on the wire 20 or on the cell conveying device 200.

While the present disclosure has been described with reference to the embodiments shown in the drawings, those embodiments are only illustrative. It should be understood by those of ordinary skill in the technical field that various modifications and equivalents may be made from those embodiments. Accordingly, the technical protection scope of the present disclosure should be defined by the appended claims.

DESCRIPTION OF REFERENCE SYMBOLS

1: tabbing apparatus, 10: wire processing apparatus of tabbing apparatus, 20: wire, 30: cell, 40: cell supplying device, 50: cell transferring device, 100: wire supplying device, 110: fixing gripper, 111: fixing support portion, 113: fixing grip portion, 115: elevating unit, 130: moving gripper, 130a: first moving gripper, 130b: second moving gripper, 131: wire gripping unit, 133: gripper moving unit, 135: elevating unit, 150: wire cutting device, 170: stretching device, 171: moving support portion, 173: moving grip portion, 175: elevating unit, 177: stretching movement unit, 200: cell conveying device, 210: drive unit, 230: conveying belt, 300: wire transferring device, 310: first transfer gripper unit, 311: transfer gripper fixing portion, 313: first transfer gripper, 3131: first gripper movement portion, 3133: fist cell entering portion, 3135: first wire contact portion, 315: second transfer gripper, 3151: second gripper movement portion, 3153: second cell entering portion, 3155: second wire contact portion, 317: gap adjusting device, 318: first gripper moving unit, 319: second gripper moving unit, 350: transfer gripper transporting unit, 351: horizontal movement unit, 352: horizontal transport unit, 354: gap adjusting unit

What is claimed is:

1. A wire processing apparatus for a tabbing apparatus, the wire processing apparatus comprising:
   a wire supplying device configured to cut a wire to a predetermined length;
   a cell conveying device, on which the wire and a cell are placed, configured to convey the wire and the cell in a conveyance direction; and
   a wire transferring device configured to receive the wire from the wire supplying device, to grip the wire and to deliver the wire to the cell conveying device,
   wherein the wire processing apparatus transfers the wire to the cell conveying device and places the cell to the wire without releasing the wire from the wire transferring device.

2. The wire processing apparatus of claim 1, wherein the wire supplying device includes:
   a fixing gripper configured to fix the wire;
   a moving gripper configured to grip the wire and to move the wire in a state where the fixing gripper releases the wire; and
   a wire cutting device positioned between the fixing gripper and the moving gripper and configured to cut the wire.

3. The wire processing apparatus of claim 2, wherein the fixing gripper includes:
   a fixing support portion on which the wire is placed;
   a fixing grip portion disposed above the fixing support portion and configured to press the wire toward the fixing support portion; and
   an elevating unit configured to move up and down the fixing grip portion.

4. The wire processing apparatus of claim 2, wherein the wire supplying device further includes a stretching device configured to apply tension to the wire fixed to the fixing gripper.

5. The wire processing apparatus of claim 4, wherein the stretching device includes:
   a moving support portion on which the wire is placed;
   a moving grip portion disposed above the moving support portion and configured to press the wire toward the moving support portion;
   an elevating unit configured to move up and down the moving grip portion; and
   a stretching movement unit configured to move the moving support portion in a direction away from the fixing gripper.

6. The wire processing apparatus of claim 2, wherein the moving gripper includes:
   a wire gripping unit configured to grip the wire; and
   a gripper moving unit configured to move the wire gripping unit such that the wire gripping unit gets close to or is spaced apart from the fixing gripper.

7. The wire processing apparatus of claim 6, wherein the moving gripper further includes an elevating unit configured to move up and down the wire gripping unit.

8. The wire processing apparatus of claim 2, wherein the moving gripper includes:
   a first moving gripper disposed apart from the fixing gripper, and configured to be movable and to grip the wire; and
   a second moving gripper positioned between the fixing gripper and the first moving gripper, and configured to be movable and to grip the wire.

9. The wire processing apparatus of claim 1, wherein the wire transferring device includes:
   a first transfer gripper unit configured to grip a rear end portion of the wire;
   a second transfer gripper unit disposed apart from the first transfer gripper unit and configured to grip a front end portion of the wire; and a transfer gripper transporting unit configured to transport the first transfer gripper unit and the second transfer gripper unit, and wherein the transfer gripper transporting unit moves the first transfer gripper unit and the second transfer gripper unit such that the cell enters between the first transfer gripper unit and the second transfer gripper unit.

10. The wire processing apparatus of claim 9, wherein the first transfer gripper unit includes a transfer gripper fixing portion, a first transfer gripper, a second transfer gripper and a gap adjusting device, wherein the transfer gripper fixing portion is fixed to the transfer gripper transporting unit, wherein the first transfer gripper includes:

a first gripper movement portion movably coupled to the transfer gripper fixing portion;

a first cell entering portion protruding from the first gripper movement portion and forming, on a top side of the first cell entering portion, a space into which a portion of the cell enters; and a first wire contact portion formed in the first cell entering portion, wherein the second transfer gripper includes:

a second gripper movement portion movably coupled to the transfer gripper fixing portion;

a second cell entering portion protruding from the second gripper movement portion and forming, on a top side of second cell entering portion, a space into which a portion of the cell enters; and a second wire contact portion formed in the second cell entering portion and disposed opposite to the first wire contact portion, and wherein the gap adjusting device is configured to adjust a gap between the first wire contact portion of the first transfer gripper and the second wire contact portion of the second transfer gripper.

11. The wire processing apparatus of claim 10, wherein the gap adjusting device includes a first gripper moving unit configured to move the first transfer gripper such that the first wire contact portion is moved toward the second wire contact portion.

12. The wire processing apparatus of claim 11, wherein the gap adjusting device further includes a second gripper moving unit configured to move the second transfer gripper such that the second wire contact portion is moved toward the first wire contact portion.

13. The wire processing apparatus of claim 12, wherein, when the first wire contact portion is moved toward the second wire contact portion, the first transfer gripper interferes with the transfer gripper fixing portion at a predetermined position to be stopped.

14. The wire processing apparatus of claim 13, wherein a magnitude of a force with which the first gripper moving unit presses the first transfer gripper is greater than a magnitude of a force with which the second gripper moving unit presses the second transfer gripper.

15. The wire processing apparatus of claim 9, wherein the transfer gripper transporting unit includes a horizontal movement unit configured to move the first transfer gripper unit and the second transfer gripper unit in a horizontal direction.

16. The wire processing apparatus of claim 15, wherein the horizontal movement unit includes:

a horizontal transport unit configured to move the first transfer gripper unit and the second transfer gripper unit by a same displacement; and a gap adjusting unit configured to adjust a gap between the first transfer gripper unit and the second transfer gripper unit.

17. The wire processing apparatus of claim 10, wherein the cell conveying device includes a conveying belt having a placement surface on which the wire and the cell are placed, and wherein the conveying belt includes an inclined portion which does not interfere with the first cell entering portion of the first transfer gripper and the second cell entering portion of the second transfer gripper when the wire transferring device places the wire on the conveying belt.

18. A wire processing method for a tabbing apparatus, the wire processing method comprising:

supplying, by a wire supplying device, a wire cut to a predetermined length;

receiving, by a first transfer gripper unit and a second transfer gripper unit of a wire transferring device, the wire from the wire supplying device by gripping a rear end portion and a front end portion of the wire, respectively, and delivering the wire to a cell conveying device; and transferring a cell to enter between the first transfer gripper unit and the second transfer gripper unit and placing the cell on the wire when the wire is delivered to the cell conveying device without releasing the wire from the wire transferring device.

19. The wire processing method of claim 18, wherein the supplying the wire comprises:

fixing, by a fixing gripper of the wire supplying device, the wire;

gripping, by a first moving gripper of the wire supplying device, the wire;

moving, by the first moving gripper, the wire in a direction away from the fixing gripper in a state where the fixing gripper releases the fixing of the wire;

gripping, by a second moving gripper of the wire supplying device, the wire, the second moving gripper being positioned between the first moving gripper and the fixing gripper;

moving the first moving gripper and the second moving gripper in the direction away from the fixing gripper; and cutting, by a wire cutting device of the wire supplying device, the wire, the wire cutting device being positioned between the fixing gripper and the second moving gripper.

* * * * *